(12) United States Patent
Mizukoshi et al.

(10) Patent No.: US 8,496,133 B2
(45) Date of Patent: Jul. 30, 2013

(54) CONTAINER FOR HOUSING A MASK BLANK, METHOD OF HOUSING A MASK BLANK, AND A MASK BLANK PACKAGE

(75) Inventors: Yasuhiro Mizukoshi, Shinjuku-ku (JP); Osamu Hanaoka, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 329 days.

(21) Appl. No.: 12/566,297

(22) Filed: Sep. 24, 2009

(65) Prior Publication Data

US 2010/0078433 A1    Apr. 1, 2010

(30) Foreign Application Priority Data

Sep. 27, 2008    (JP) ................................. 2008-249337

(51) Int. Cl.
*B65D 6/24*    (2006.01)
*B65D 45/20*    (2006.01)

(52) U.S. Cl.
USPC .......... 220/693; 220/4.25; 220/315; 220/322; 220/324; 220/326; 355/74; 206/711

(58) Field of Classification Search
USPC ......... 206/454–456; 220/4.25, 315, 321–326; 220/693; 355/72, 74, 75
See application file for complete search history.

(56) References Cited

U.S. PATENT DOCUMENTS

| 3,064,851 | A | * | 11/1962 | Guigli | 16/232 |
| 3,615,006 | A | * | 10/1971 | Freed | 6/454 |
| 3,715,053 | A | * | 2/1973 | Carter | 406/145 |
| 4,182,530 | A | * | 1/1980 | Hodge | 294/68.26 |
| 4,501,378 | A | * | 2/1985 | Berfield | 220/324 |
| 4,520,925 | A | * | 6/1985 | Johnson | 206/711 |
| 4,817,799 | A | * | 4/1989 | Gregerson et al. | 206/445 |
| 5,921,422 | A | * | 7/1999 | Hunter et al. | 220/4.02 |
| 5,947,462 | A | * | 9/1999 | Roussel | 210/232 |
| 6,612,625 | B1 | * | 9/2003 | Barber et al. | 292/87 |

(Continued)

FOREIGN PATENT DOCUMENTS

JP    63082788 U  *  5/1988
JP    01-39653 B2    8/1989

(Continued)

OTHER PUBLICATIONS

12566297—JP2008087847A_PAJ Machine Translation.*
Korean Office Action corresponding to Korean Patent Application No. 9-5-2011-027102729, mailed May 20, 2011.

*Primary Examiner* — J. Gregory Pickett
*Assistant Examiner* — Ned A Walker
(74) *Attorney, Agent, or Firm* — Sughrue Mion, PLLC

(57) ABSTRACT

A mask blank container adapted to house a mask blank with a resist film. The container comprises a container body 5 for receiving the mask blank; a cap member 6 to be put on the container body; and a fixing member 9 adapted to fix the container body and the cap member to each other when the cap member is put on the container body. The container body and the cap member have fitting portions 51 and 61 made of a resin material and fitted to each other, respectively. The fixing member comprises a first member 91 having an engaging portion 91 a to be engaged with the fitting portion of the cap member, and a second member 92 having an engaging portion 93 to be engaged with the fitting portion of the container body. A distance between the engaging portions of the first and the second members is desired to be variable.

8 Claims, 6 Drawing Sheets

U.S. PATENT DOCUMENTS

| | | | | |
|---|---|---|---|---|
| 7,029,013 | B2 * | 4/2006 | Yajima et al. | 277/637 |
| 7,463,338 | B2 * | 12/2008 | Kurikawa | 355/75 |
| 7,477,358 | B2 * | 1/2009 | Phillips et al. | 355/75 |
| 7,506,778 | B2 * | 3/2009 | DaSilva et al. | 220/23.4 |
| 7,631,778 | B2 * | 12/2009 | Yoshiyama | 220/326 |
| 7,838,182 | B2 * | 11/2010 | Kurikawa | 430/5 |
| 8,297,464 | B2 * | 10/2012 | Grenier et al. | 220/326 |
| 2001/0049065 | A1 * | 12/2001 | Williams | 430/5 |
| 2005/0006266 | A1 * | 1/2005 | Kurikawa | 206/455 |
| 2006/0237338 | A1 * | 10/2006 | Nakamae | 206/316.1 |
| 2006/0249522 | A1 * | 11/2006 | Ringo | 220/784 |
| 2007/0228037 | A1 * | 10/2007 | Yoshiyama | 220/4.25 |
| 2008/0257779 | A1 * | 10/2008 | Kurikawa | 206/707 |
| 2009/0029271 | A1 * | 1/2009 | Kurikawa | 430/5 |
| 2009/0035666 | A1 * | 2/2009 | Kurikawa | 430/5 |

FOREIGN PATENT DOCUMENTS

| | | | |
|---|---|---|---|
| JP | 8255826 A | * | 10/1996 |
| JP | 2005070390 A | * | 3/2005 |
| JP | 2007199380 A | * | 8/2007 |
| JP | 2008087847 A | | 4/2008 |

* cited by examiner

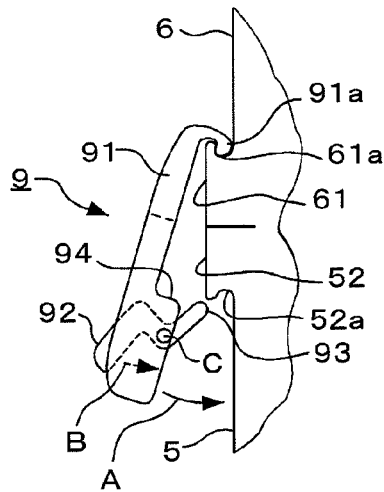 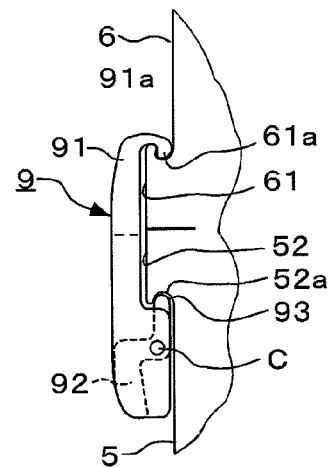
FIG. 3A    FIG. 3B
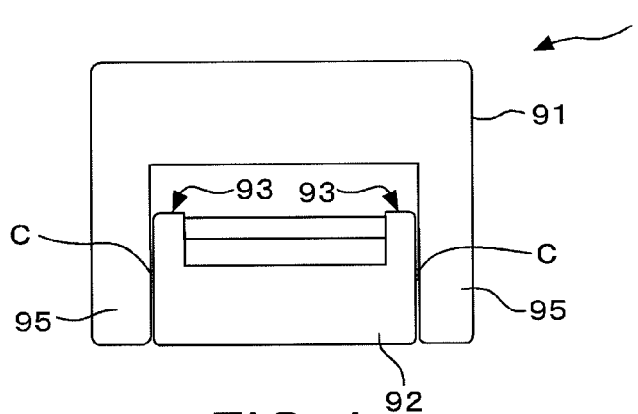
FIG. 4
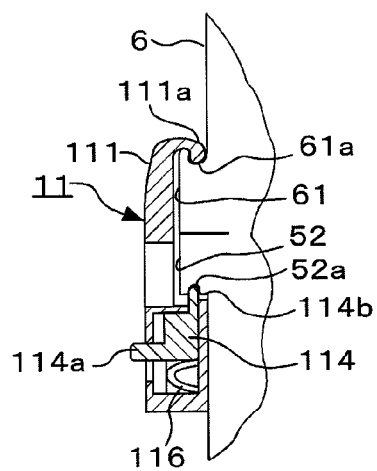
FIG. 5

PRIOR ART

CONTAINER FOR HOUSING A MASK BLANK, METHOD OF HOUSING A MASK BLANK, AND A MASK BLANK PACKAGE

This application is based upon and claims the benefit of priority from Japanese patent application No. 2008-249337, filed on Sep. 27, 2008, the disclosure of which is incorporated herein in its entirety by reference.

TECHNICAL FIELD

This invention relates to a container for housing a mask blank for use in fabrication of a photomask or the like to be used in manufacture of an electronic device and to a method of housing the mask blank.

BACKGROUND ART

Following rapid development of the IT (Information Technology) industry, a recent electronic device, in particular, a semiconductor device, a color filter or a TFT (Thin Film Transistor) device for a LCD (Liquid Crystal Display) monitor, or the like, is required to have a finer structure. One of techniques supporting fine process technology for such a finer structure is a lithography technique using a photo mask called a transfer mask. In the lithography technique, a silicon wafer with a resist film is exposed through the transfer mask to an electromagnetic wave emitted from an exposure light source so that a fine pattern is formed on the silicon wafer. Generally, the transfer mask is manufactured by preparing a mask blank comprising a light transmitting substrate and a light shielding film formed thereon and then forming, as a pattern of the transfer mask, an original pattern on the mask blank by the use of the lithography technique. If foreign matters such as particles are present on a surface of the mask blank, this may result in occurrence of a defect of the pattern formed on the transfer mask. Therefore, the mask blank must be stored in a clean environment so that no foreign matters are adhered or attached to the surface of the mask blank.

For example, as a conventional container for housing, storing, and carrying such mask blank, a mask carrying case is disclosed in JP-B-H01-39653 (Patent Document 1). Specifically, the conventional container for housing and storing a mask blank comprises an inner case called a carrier, an outer case (container body), and a cap. Generally, several to several tens of mask blanks are held in the inner case in parallel to one another. The inner case with the mask blanks held therein is received in the outer case. Then, the cap is put on the outer case. In this manner, the mask blanks are housed in the container.

FIGS. 11 to 13 show a container similar in structure to that disclosed in Patent Document 1. FIG. 11 is a perspective view showing a cap of the container. FIG. 12 is a perspective view showing a state where a mask blank is housed in an inner case. FIG. 13 is a perspective view of a container body (outer case) of the container.

The container comprises an inner case 2 for housing a mask blank 1, a container body 3 for housing the inner case 2, and a cap 4 put on an opening side of the container body 3.

The inner case 2 is provided with a plurality of pairs of grooves 21 and 22 formed at a predetermined interval on a pair of opposite inner surfaces opposite to each other in one direction, respectively. The grooves 21 and 22 extend from an opening side (upper side) towards a bottom side (lower side) of the inner case 2. Opening windows (not shown) are formed at bottom portions of the grooves 21 and 22 on the bottom side of the inner case 2. An opening portion 27 is formed on a bottom surface of the inner case 2. Furthermore, a substrate supporting portion 26 is formed on the bottom side of the inner case 2 and supports a lower end face of the mask blank 1 (FIG. 12). On a pair of opposite outer surfaces of the inner case 2 opposite to each other in the other direction perpendicular to the one direction, recessed surfaces 28 and 29 for fixing the inner case 2 housed in the container body 5 extend from the bottom side to an intermediate position towards the opening side. When a plurality of mask blanks 1 are inserted into the inner case 2 along the grooves 21 and 22, the mask blanks 1 stand in parallel to one another at the predetermined interval.

The container body 3 is provided with protruding portions 31 and 32 which are formed on a pair of opposite inner surfaces opposite to each other in the other direction and which are adapted to be brought into contact with the recessed surfaces 28 and 29 of the inner case 2. The protruding portions 31 and 32 have bottom portions connected to a bottom surface of the container body 3 (FIG. 13). On a pair of opposite outer surfaces opposite to each other in the one direction, projecting portions 33 and 34 are formed on the opening side, respectively. The projecting portions 33 and 34 have projecting surfaces substantially flush with an outer peripheral surface 36 formed adjacent to and slightly below an opening edge 35 of the container body 3.

The cap 4 has engaging portions 41 and 42 extending upward from the center of a pair of opposite lower edges 47 (i.e., opening-side edges to be fitted to the container body 3, turned upside in FIG. 11) opposite to each other in the one direction, and a pair of recessed portions 43 and 44 formed on the engaging portions 41 and 42, respectively. With this structure, when the cap 4 is put on the container body 3, the recessed portions 43 and 44 are engaged with the projecting portions 33 and 34 of the container body 3, respectively, so that the cap 4 and the container body 3 are fixed to each other. The cap 4 is further provided with stoppers 45 and 46 which are formed on a pair of opposite inner surfaces opposite to each other in the other direction, respectively, and which are faced to each other. The stoppers 45 and 46 are adapted to be brought into contact with an upper end face 25 (i.e., opening-side edges) of the inner case 2 to support and fix the inner case 2 in a vertical direction.

SUMMARY OF THE INVENTION

Following recent improvement in performance of the electronic device, the pattern formed on the transfer mask is also required to be finer. In order to form such a finer pattern, the mask blank must have an extremely high cleanliness. Therefore, it is necessary to maintain as high cleanliness as possible during storage of the mask blank, in particular, the mask blank with a resist film, by minimizing adhesion of foreign matters to the mask blank.

However, the conventional container is disadvantageous in the following respect. As described above, when the cap 4 is put on the container body 3, the recessed portions 43 and 44 of the cap 4 are fitted to the projecting portions 33 and 34 of the container body 3, respectively, so that the cap 4 and the container body 3 are fixed to each other. Since each of the cap 4 and the container body 3 is made of a resin material such as polypropylene, particles are generated upon opening and closing the cap 4 due to frictional contact between the recessed portions 43 and 44 of the cap 4 and the projecting portions 33 and 34 of the container body 3. The generated particles are adhered to the container. For example, when the cap 4 is opened, the particles enter into the container to be adhered to the mask blank, causing a foreign matter defect with very high probability.

Instead of the above-mentioned structure in which the recessed portions 43 and 44 of the cap 4 and the projecting portions 33 and 34 of the container body 3 are fitted to each other, another structure is also known. That is, the cap 4 and the container body 3 may be fixed to each other by fitting a fixing hook 10 having a U-shaped section as shown in FIG. 14 to a connecting portion (joint portion) between the outer peripheral surface 36 adjacent to the opening edge 35 of the container body 3 and an outer peripheral surface 48 at a lower edge of the cap 4. However, every time when the fixing hook 10 is attached or detached, it is necessary to slide the fixing hook 10 from an end of the container 3 to a fixed position (generally, a center position) and vice versa. Thus, an operation of opening or closing the container 3 is troublesome. In addition, due to generation of particles during sliding of the fixing hook 10, a very large amount of dust is produced.

It is therefore an object of this invention to provide a mask blank container which is capable of suppressing adhesion of particles to a mask blank due to dust generation upon opening or closing the container and to provide a method of housing a mask blank.

Other objects of the present invention will become clear as the description proceeds.

In order to solve the above-mentioned problem, the present inventor carefully and devotedly studied. As a result, the present inventor found that, by improving a structure of fixing a cap and a container body, dust generation during opening and closing the cap is suppressed and, as a result, adhesion of particles to a mask blank can effectively be suppressed. Thus, the present invention has been completed.

According to one aspect of this invention, there is provided a mask blank container for housing a mask blank with a resist film, comprising a container body for receiving the mask blank, a cap member to be put on the container body, and a fixing member adapted to fix the container body and the cap member to each other when the cap member is put on the container body, wherein the container body and the cap member have fitting portions made of a resin material and fitted to each other, respectively, wherein the fixing member comprises a first member having an engaging portion to be engaged with the fitting portion of the cap member and a second member having an engaging portion to be engaged with the fitting portion of the container body, and wherein a distance between the engaging portions of the first and the second members is variable.

According to another aspect of this invention, there is provided a method of housing a mask blank, wherein the mask blank with a resist film is housed in the above-mentioned mask blank container.

According to still another aspect of this invention, there is provided a mask blank package in which a mask blank is housed by using the above-mentioned method.

BRIEF DESCRIPTION OF THE DRAWING

FIG. 3A is an enlarged side view of a characteristic part of the container in FIG. 1 in the state before the cap member is fixed to the container body;

FIG. 3B is an enlarged side view of a characteristic part of the container in FIG. 1 in the state where the cap member is fixed to the container body;

FIG. 4 is a front view of a fixing member which fixes the cap member to the container body in FIGS. 2A through 3B;

FIG. 5 is an enlarged sectional view of a characteristic part of a container according to another embodiment of this invention in the state where a cap member is fixed to a container body;

DESCRIPTION OF EMBODIMENTS

Figure 1:
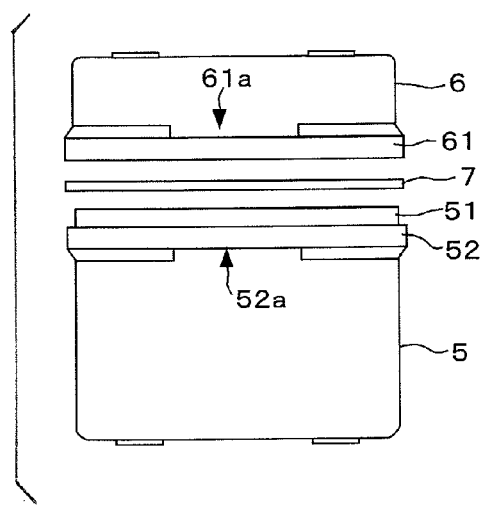
FIG. 1 is a front view of a container according to one embodiment of this invention in a state where a container body and a cap member are separated from each other.

Now, embodiments of this invention will be described with reference to the drawing.

Figures 2A, 2B:
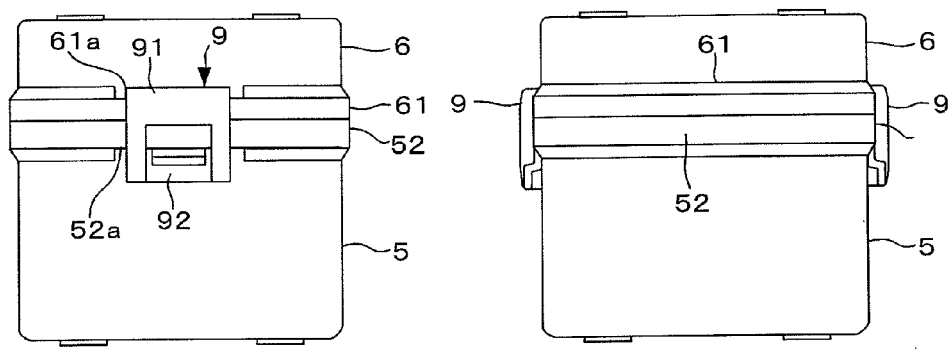
FIG. 2A is one side view of the container in FIG. 1 in the state where the cap member is fixed to the container body.
FIG. 2B is another side view of the container in FIG. 1 in the state where the cap member is fixed to the container body.

Referring to FIG. 1, FIG. 2A and FIG. 2B, a mask blank container (may simply be referred to as a "container" hereinafter) according to an embodiment of this invention comprises a container body 5 opened at its upper end and a cap member 6 to be put on the container body 5. The container is for housing a mask blank therein. As a whole, the container body 5 and the cap member 6 are similar in structure to the container body 3 and the cap 4 of the conventional container except that the cap 4 illustrated in FIG. 11 has the recessed portions 43 and 44 and the container body 3 illustrated in FIG. 13 has the projecting portions 33 and 34.

Although not shown in the figure, the container according to this embodiment may comprise an inner case 2 (see FIG. 12) for holding a plurality of mask blanks, like the conventional container described above. Alternatively, without using the inner case, the mask blanks may be directly housed in the container body 5 provided with grooves or the like. However, use of the inner case is convenient because several to several tens of mask blanks held in the inner case can collectively be handled.

A mask blank to be housed in the container comprises a glass substrate having a principal surface of a square shape, a light shielding thin film, such as a chromium film, deposited on the principal surface of the glass substrate, and, for example, a resist film formed on the thin film. The container according to this embodiment comprises an inner case for housing the mask blank and similar in structure to that of the conventional container, a container body 5 for housing the inner case, and a cap member 6 to be put on the container body 5 on an opening side of the container body 5 (see FIGS. 2A and 2B). When the cap member 6 is put on the container body 5, a side wall portion 61 adjacent to a lower edge of the cap member 6 and slightly widened outward overlaps back and forth with an opening edge 51 of the container body 5. Simultaneously, the side wall portion 61 adjacent to the lower edge of the cap member 6 is flush with a side wall portion 52 formed below the opening edge 51 of the container body 5 and slightly widened outward. In this state, the cap member 6 and the container body 5 are connected to each other.

When the cap member 6 is closed, the opening edge 51 of the container body 5 and the side wall portion 61 of the cap member 6 serve as fitting portions fitted to each other. In order to improve the sealability of the container when the cap member 6 is closed, an annular elastic member 7 of an appropriate size is fitted along the opening edge 51 of the container body 5 (see FIG. 1). As the elastic member 7, use is preferably made of a material which releases a less amount of a chemical component gas even upon occurrence of variation in temperature or pressure of an atmosphere. For example, polyolefin elastomer or polyester elastomer may be used as the elastic member 7. When the cap member 6 is put on the container body 5, the elastic member 7 interposed between the fitting portions of the container body 5 and the cap member 6 is pressed so as to keep a highly sealed condition in the container.

In order to fix the container body 5 and the cap member 6 to each other in the state where the mask blank is housed inside and the cap member 6 is put on the container body 5, a fixing member 9 separate from the container body 5 and the cap member 6 is used. The fixing member 9 has a first member 91 and a second member 92 rotatably supported by the first member 91. In a front view illustrated in FIG. 4, the first member 91 has a U shape with a pair of arms 95, 95 extending downward. In side views shown in FIGS. 3A and 3B, the first member 91 has an engaging portion 91a formed at its upper end and bent inward, and a step portion 94 formed at a position slightly below a center position. The second member 92 is disposed between the arms 95, 95 of the first member 91. The second member 92 has opposite sides supported by the arms 95, 95 to be rotatable around a pair of shafts C, C as rotation axes, with small spaces left from the arms 95, 95 of the first member 91, respectively. In the side views shown in FIGS. 3A and 3B, the second member 92 has a generally S shape as a whole and has an engaging portion 93 formed at its top end (upper end). Thus, the second member 92 is rotatably connected to the first member 91.

Next, description will be made of a method of fixing the container body 5 and the cap member 6 to each other by using the above-mentioned fixing member 9 in the state where the cap member 6 is put on the container body 5.

The side wall portion 61 of the cap member 6 has an engaging recess 61a which is formed at a part of an upper end thereof by depressing the part inward or cutting out the part. At a position corresponding to the engaging recess 61a of the cap member 6, the side wall portion 52 of the container body 5 has an engaging recess 52a which is similarly formed at a part of a lower end thereof by depressing the part inward or cutting out the part. In the state where the cap member 6 is put on the container body 5, the engaging portion 91a of the first member 91 of the fixing member 9 is engaged with the fitting portion of the cap member 6, i.e., the engaging recess 61a of the side wall portion 61 of the cap member 6 (see FIG. 3A). Next, a lower part of the first member 91 is moved towards the container (in a direction depicted by an arrow A in FIG. 3A) and, simultaneously, a lower part of the second member 92 is rotated towards the container (in a direction depicted by an arrow B in FIG. 3A). As a consequence, the engaging portion 93 of the second member 92 is engaged with the fitting portion of the container body 5, i.e., the engaging recess 52a of the side wall portion 52 of the container body 5 (see FIG. 3B). At this time, the step portion 94 of the first member 91 is fitted at a position slightly below the engaging recess 52a of the container body 5.

According to the mask blank container in this embodiment, by using the fixing member 9 in the above-mentioned manner, the cap member 6 and the container body 5 are fixed to each other in the state where the mask blank is housed inside the container and the cap member 6 is put on the container body 5. When the container is opened or closed, the fixing member 9 is attached to or detached from the container. In order to attach the fixing member 9, the engaging portion 91a of the first member 91 is engaged with the engaging recess 61a of the cap member 6 at first. Then, the second member 92 is rotated so that the engaging portion 93 of the second member 92 is moved towards and brought into contact with the engaging recess 52a of the container body 5 to be engaged with the engaging recess 52a. In order to detach the fixing member 9, an operation reverse to that mentioned above is carried out. Therefore, when the fixing member 9 is attached or detached, friction between the fixing member 9 and the fitting portions of the container is prevented and, therefore, dust generation upon opening or closing the container is suppressed. As a result, it is possible to effectively suppress adhesion of particles to the mask blank due to entry of particles into the container, for example, when the cap member 6 is opened.

Preferably, a material of the fixing member 9 is appropriately selected from various kinds of resin materials, such as polycarbonate, polyethylene, polypropylene, polybutylene terephthalate, and acrylonitrile butadiene styrene (ABS) and various kinds of metal materials such as stainless steel and aluminum. Particularly, a resin material is preferable. When the fixing member 9 is formed of the resin material, it is possible to securely fix the container against external shock (for example, vibration) during transportation and conveyance so as to prevent dust generation.

The fixing member 9 fixes the container at least at two opposite sides thereof so that the mask blank housed in the container is fixed under a substantially uniform fixing load. Therefore, even upon occurrence of vibration during transportation and conveyance, it is possible to suppress particle generation due to friction between the mask blank housed in the container and plastic parts of the container supporting the mask blank and to prevent adhesion of particles to the mask blank. More preferably, the container is fixed at four sides thereof.

In the container according to this embodiment, supporting means made of a resin material and adapted to support a top of an end face of the mask blank housed in the container is formed inside the cap member 6. As the supporting means, a plurality of supporting members 8 each of which is made a resin material and adapted to support the top of the upper end face of the mask blank are formed inside the cap member 6.

Figure 9:
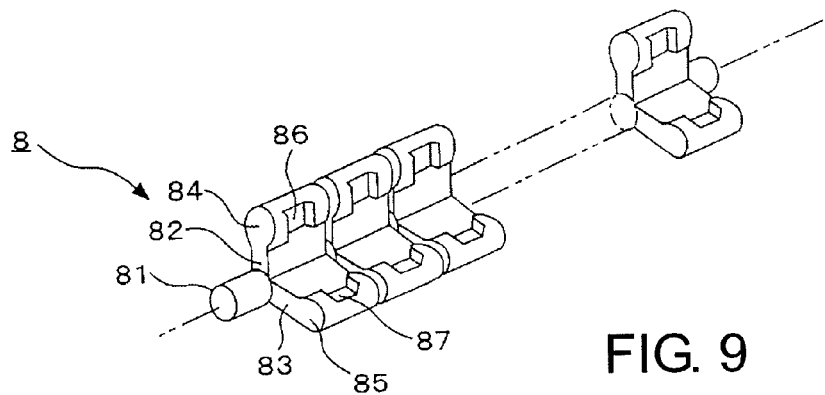
FIG. 9 is a perspective view of a supporting member for supporting a mask blank in the container.

As illustrated in FIG. 9, the supporting member 8 has a shaft 81 having a circular section and linearly extended, a plurality of pairs of connecting portions 82 and 83 extended from a side surface of the shaft 81 in directions perpendicular to each other in section, respectively, and a plurality of pairs of contacting portions 84 and 85 having a generally circular section and formed at ends of the connecting portions 82 and 83, respectively. The pairs of connecting portions 82 and 83 and the pairs of contacting portions 84 and 85 are arranged at a predetermined interval so that a plurality of mask blanks to be housed in the container are spaced from one another at an appropriate interval. The contacting portions 84 and 85 have contacting surfaces 86 and 87 depressed inward into a recessed shape and perpendicular to each other.

The above-mentioned supporting members 8, two in number, are fixed to a pair of opposite inner surfaces of the cap member 6 to be faced to each other.

A resin material forming the supporting member 8 is not particularly limited but it is preferable to use a material which releases a less amount of a chemical component gas even upon occurrence of variation in temperature or pressure of an atmosphere. For example, use is preferably made of at least one resin material selected from polybutylene terephthalate, polyethylene terephthalate, polyether ether ketone, polyethylene, polypropylene, cyclic polyolefin, polyolefin elastomer, polyester elastomer, polycarbonate, and fluorine-based resin.

Figure 10:
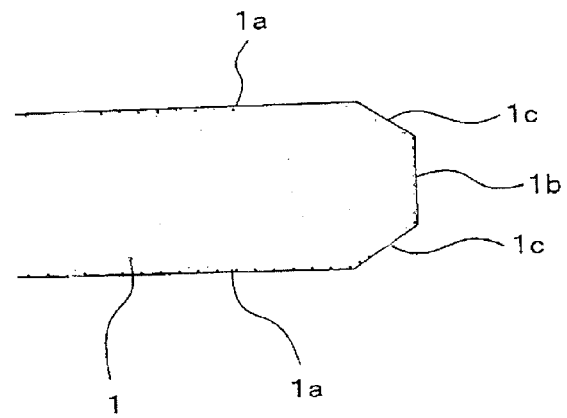
FIG. 10 is a sectional view of a part of the mask blank.

The contacting surfaces 86 and 87 of the contacting portions 84 and 85 of each supporting member 8 are contacted with adjacent end faces of each mask blank 1 at the top of the upper part thereof to support the mask blank 1 in a fixed state. Since the contacting surfaces 86 and 87 of each supporting member 8 are depressed into a recessed shape, a side surface 1b and chamfered surfaces 1c (or a part thereof) of each of the adjacent end faces of the mask blank 1 (see FIG. 10) are adequately supported by the supporting member 8.

As the above-mentioned supporting means is formed inside the cap member 6, it is possible to relax or absorb the vibration, for example, during transportation and conveyance and to securely fix the mask blank 1 so that dust generation is prevented.

Each of the container body 5 and the cap member 6 is made of a resin material. Preferably, the resin material is appropriately selected from various kinds of resin materials, such as polypropylene, acrylic resin, polyethylene, polycarbonate, polyester, polyamide, polyimide, polyethylene sulfide, polybutylene terephthalate (PBT), and acrylonitrile butadiene styrene (ABS). Among others, polycarbonate, polyester, or polybutylene terephthalate is particularly preferable. If electric charges are accumulated during storage of the mask blanks, discharge breakdown may be caused to occur in a mask manufacturing process, resulting in occurrence of pattern defects. In view of the above, a conductive material such as carbon may be mixed into the resin material of the container body 5 to provide conductivity.

Figure 6:
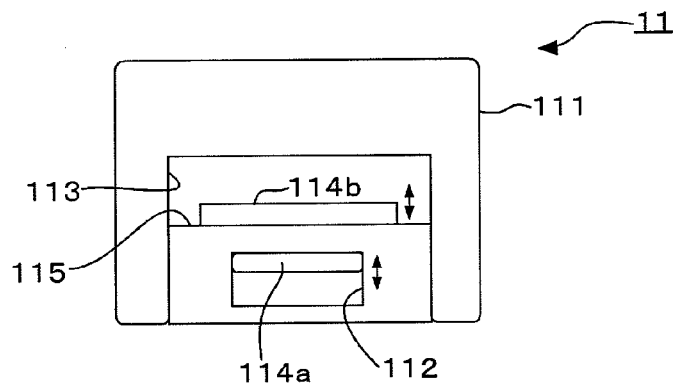
FIG. 6 is a front view of a fixing member which fixes a cap member to the container body in FIG. 5.

Referring to FIGS. 5 and 6, a mask blank container according to another embodiment of this invention has a fixing member 11 comprising a first member 111 and a second member 114. In a front view shown in FIG. 6, the first member 111 has an opening portion 113 formed at an approximate center and an opening 112 formed below the opening 113 and slightly smaller than the opening 113. In a side view shown in FIG. 5, the first member 111 has an engaging portion 111a formed at an upper end thereof and bent inward, and a step portion 115 (a lower end face of the opening 113) formed at a position slightly lower than a center position. The second member 114 has a handle portion 114a disposed in a space formed below the step portion 115 of the first member 111 and protruding from the opening 112 in a horizontal direction, and an engaging portion 114b movable upward from the step portion 115. The second member 114 is urged by a spring member 116 such as a leaf spring to be located at an uppermost position.

Next, description will be made of a method of fixing the container body 5 and the cap member 6 to each other by using the above-mentioned fixing member 11 in the state where the cap member 6 is put on the container body 5.

In the state where the cap member 6 is put on the container body 5, the handle portion 114a of the fixing member 11 is lowered to a lowest position (at this time, the engaging portion 114b is located at a position lower than the step portion 115). In this state, the engaging portion 111a of the first member 111 is engaged with the fitting portion of the cap member 6, i.e., the engaging recess 61a of the side wall portion 61 of the cap member 6. Then, the handle portion 114 is released. Since the second member 114 is urged by the spring portion 116 to be located at the uppermost position, the engaging portion 114b of the second member 114 protrudes upward from the step portion 115 to be engaged with the fitting portion of the container body 5, i.e., the engaging recess 52a of the side wall portion 52 of the container body 5 (see FIG. 5). In order to detach the fixing member 11, an operation reverse to that mentioned above will be carried out.

By using the above-mentioned fixing member 11, a distance between the engaging portion 111a of the first member 111 and the engaging portion 114b of the second member 114 is variable. Therefore, when the fixing member 11 is attached or detached, friction between the fixing member 11 and the fitting portions of the container is prevented and, therefore, dust generation upon opening or closing the container is suppressed. As a result, it is possible to effectively suppress adhesion of particles to the mask blank due to entry of particles into the container, for example, when the cap member 6 is opened.

Figure 7:
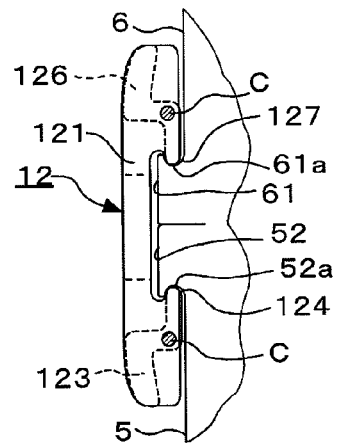
FIG. 7 is an enlarged side view of a characteristic part of a container according to still another embodiment of this invention in the state where a cap member is fixed to a container body.
Figure 8:
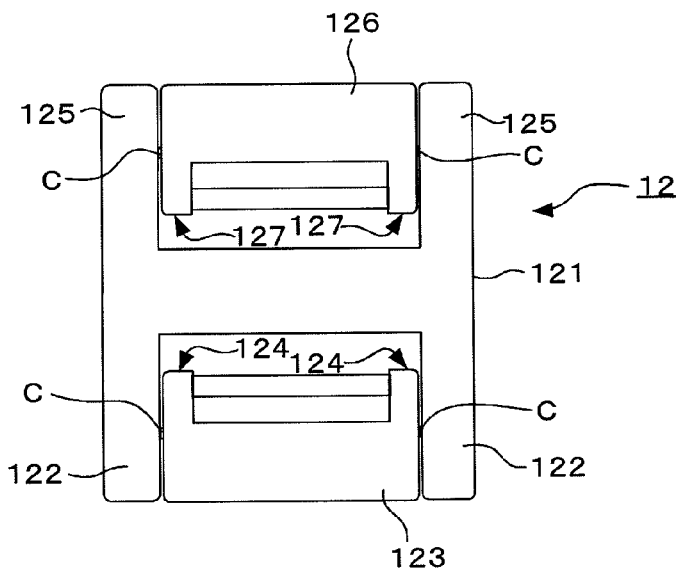
FIG. 8 is an enlarged front view of the characteristic part of FIG. 7.

Referring to FIGS. 7 and 8, a mask blank container according to still another embodiment of this invention has a fixing member 12. The fixing member 12 comprises a first member 126, a second member 123, and a third member 121 rotatably connecting each of the first and the second members 126 and 123. In a front view shown in FIG. 8, the third member 121 has an H shape as a whole. The first member 126 is disposed between first-paired arms 125, 125 of the third member 121. The first member 126 has opposite sides supported by the first-paired arms 125, 125 of the third member 121 to be rotatable around shafts C, C as rotation axes, with small spaces left from the first-paired arms 125, 125. In a side view shown in FIG. 7, the first member 126 has a generally S shape as a whole and has an engaging portion 127 formed at its top end (upper end) (lower end in FIG. 7). Thus, the first member 126 is rotatably connected to the third member 121. On the other hand, the second member 123 is disposed between second-paired arms 122, 122 of the third member 121. The second member 123 has opposite sides supported by the second-paired arms 122, 122 of the third member 121 to be rotatable around shafts C, C as rotation axes, with small spaces left from the second-paired arms 122, 122. Similarly, the second member 123 has a generally S shape as a whole and has an engaging portion 124 formed at its top end (upper end). Thus, the second member 123 is rotatably connected to the third member 121.

Next, description will be made of a method of fixing the container body 5 and the cap member 6 to each other by using the above-mentioned fixing member 12 in the state where the cap member 6 is put on the container body 5.

In the state where the cap member 6 is put on the container body 5, the fixing member 12 is moved towards the container. Simultaneously, an upper part of the first member 126 is rotated towards the container and a lower part of the second member 123 is similarly rotated towards the container. As a consequence, the engaging portion 127 of the first member 126 is engaged with the fitting portion of the cap member 6, i.e., the engaging recess 61a of the side wall portion 61 of the cap member 6. On the other hand, the engaging portion 124 of the second member 123 is engaged with the fitting portion of the container body 5, i.e., the engaging recess 52a of the side wall portion 52 of the container body 5 (see FIG. 7).

By the use of the above-mentioned fixing member 12 also, when the fixing member 12 is attached or detached, friction between the fixing member 12 and the fitting portions of the container is prevented and, therefore, dust generation upon opening or closing the container is suppressed. Therefore, it is possible to effectively suppress adhesion of particles to the mask blank due to entry of particles into the container, for example, when the cap member 6 is opened.

In the mask blank container according to each of the above-mentioned embodiments, the fixing member can be removed from the container. For example, it is assumed that, when the mask blanks are housed by using an automated robot, the fixing member is removed before the container is set to the automated robot. Then, a side surface of the container body is substantially flat so that the container can be smoothly set to the automated robot without interference. If the fixing member is permanently fixed to the container, for example, to the cap member and can not be removed, the fixing member may be undesirably brought into contact with the mask blank when it is taken out from the container. However, if the fixing member is removable, such risk is avoided.

Hereinafter, a specific example and a comparative example will be described.

Example 1

On a synthetic quartz substrate (having a size of 6-inch square), a chromium film (light shielding film) having an antireflection function was formed as a surface layer by sputtering. On the chromium film, a resist film for electron beam lithography, which is a chemically amplified resist of a positive type, was formed by spin coating. Thus, a mask blank with a resist film was manufactured.

A plurality of mask blanks, 20 in number, produced as mentioned above were housed in four containers, five blanks in each container. As the containers, the containers according to the embodiment illustrated in FIGS. 1 through 4 were used. The cap member 6 was made of acrylonitrile butadiene styrene (ABS). Each of the container body 5 and the inner case was made of polypropylene. The fixing member 9 was made of ABS. The supporting member 8 fixed to the cap member 6 was made of polybutylene terephthalate. The elastic member 7 was made of polyolefin elastomer. The housing operation was carried out in a clean room.

In the clean room, the fixing member 9 was detached from the container and the cap member 6 was opened. Then, the cap member 6 was closed again and the fixing member 9 was attached to the container. The above-mentioned opening and closing operations of the cap member 6 was performed successively 50 times.

After the opening and closing operations of the cap member 6, the mask blanks were taken out from the container. Using a defect inspection apparatus (M2350 manufactured by Lasertec Corporation), the number of defects (having a size of 90 µm or more) due to foreign matters adhered to the principal surface of the mask blank was measured. Evaluation was carried out as follows. In advance, the number of defects on the mask blank before it was housed into the container was measured in the manner similar to that mentioned above. With respect to the number of defects measured in advance, an increase in number of defects after the opening and closing operations of the cap member 6 was calculated as a measure of evaluation. As a result, in this example, an increase in number of defects was 1.3 in average. Thus, it is possible to effectively suppress adhesion of particles to the mask blank as a result of the opening and closing operations of the cap member 6.

Comparative Example

Figure 11:
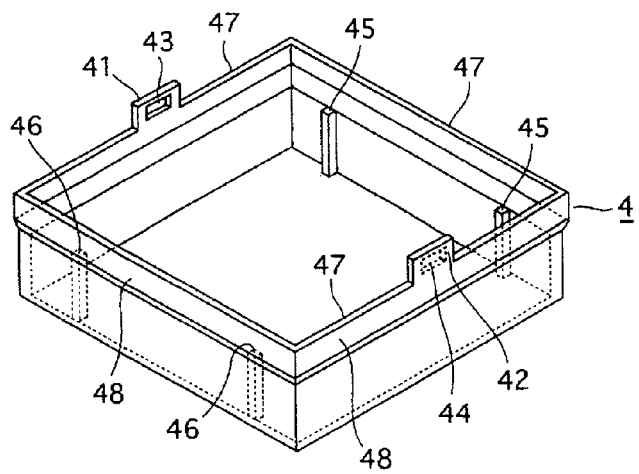
FIG. 11 is a perspective view of a cap of a conventional container.
Figure 12:
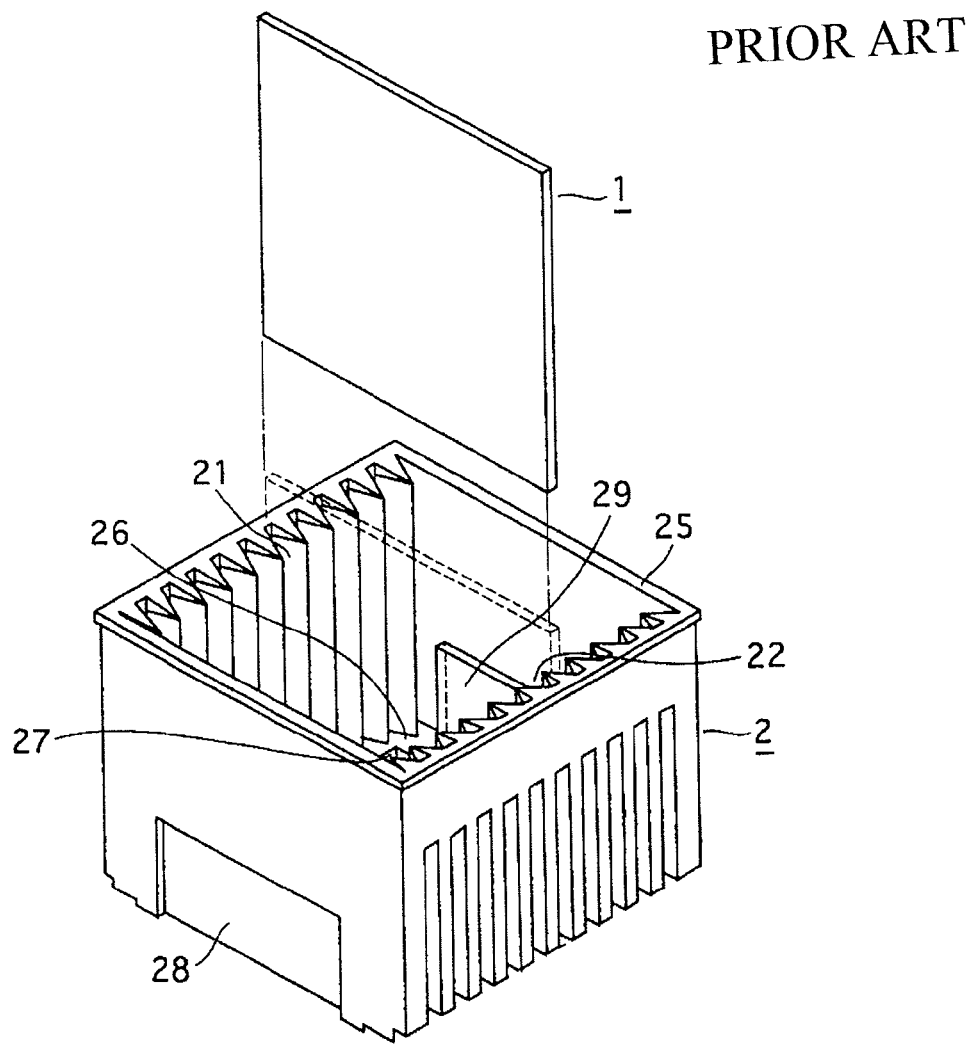
FIG. 12 is a perspective view showing the state where a mask blank is housed in an inner case.
Figure 13:
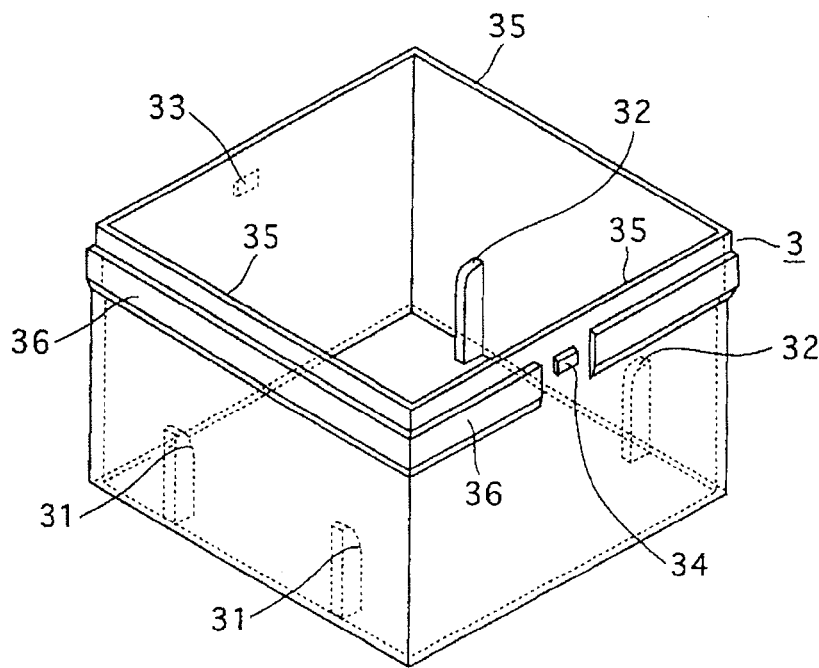
FIG. 13 is a perspective view of a container body (outer case) of the conventional container.
Figure 14:
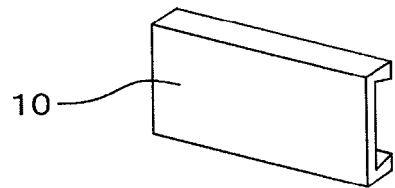
FIG. 14 is a perspective view of a conventional fixing hook.

Mask blanks produced in the manner similar to Example 1 were housed in containers in the manner similar to Example 1 except that the conventional container illustrated in FIGS. 11 to 13 was used. The cap 4 was made of acrylonitrile butadiene styrene (ABS). Each of the container body 3 and the inner case 2 was made of polypropylene.

The recessed portions 43 and 44 of the cap 4 of the container were engaged with and disengaged from the projecting portions 33 and 34 of the container body 3. Thus, opening and closing operations of the cap 4 were performed successively 50 times.

After the opening and closing operations of the cap 4 mentioned above, measurement was made of an increase in number of defects after the opening and closing operations of the cap 4 with respect to the number of defects before the mask blank was housed into the container, in the manner similar to Example 1. As a result, in the comparative example, an increase in number of defects was as large as 6.8 in average. Thus, it is not possible to suppress adhesion of particles to the mask blank as a result of the opening and closing operations of the cap 4. Supposedly, this is because dust generation following the opening and closing operations of the cap 4 is very large in case of the conventional container.

Hereinbelow, various embodiments of this invention and the effects obtained thereby will be described.

(1) A mask blank container for housing a mask blank with a resist film, comprising a container body 5 for receiving the mask blank, a cap member 6 to be put on the container body 5, and a fixing member 9 or 12 adapted to fix the container body 5 and the cap member 6 to each other when the cap member 6 is put on the container body 5, wherein the container body 5 and the cap member 6 have fitting portions 51 and 61 made of a resin material and fitted to each other, respectively, wherein the fixing member 9 or 12 comprises a first member 91 or 121 having an engaging portion 91a to be engaged with the fitting portion 61 of the cap member 6 and a second member 92 having an engaging portion 93 to be engaged with the fitting portion 51 of the container body 5, and wherein a distance between the engaging portions 91a and 93 of the first and the second members 91 and 92 is variable.

With this structure, when the fixing member 9 is attached or detached, friction between the fixing member 9 and the container can be prevented to suppress dust generation. Therefore, it is possible to effectively suppress adhesion of particles to the mask blank due to entry of particles into the container, for example, when the cap member 6 is opened.

(2) The mask blank container according to item (1), wherein the first and the second members 91 and 92 are rotatably connected to each other.

With this structure, the first member 91 is engaged with the cap member 6 and thereafter the second member 92 is rotated to be engaged with the container body 5. Thus, it is possible to effectively prevent friction upon attaching or detaching the fixing member 9 so as to suppress dust generation. Accordingly, it is possible to effectively suppress adhesion of particles to the mask blank due to entry of particles into the container, for example, when the cap member 6 is opened.

(3) The mask blank container according to item (1), wherein the fixing member 12 comprises a third member 121 to which each of the first and the second members 126 and 123 is rotatably connected.

With this structure, the first member 126 and the second member 123 are respectively rotated via the third member 121 so that the first member 126 is engaged with the cap member 6 while the second member 123 is engaged with the container body 5. Thus, it is possible to effectively prevent friction upon attaching or detaching the fixing member 12 so as to suppress dust generation. Accordingly, it is possible to effectively suppress adhesion of particles to the mask blank due to entry of particles into the container, for example, when the cap member 6 is opened.

(4) The mask blank container according to any one of items (1) to (3), wherein the fixing member 9, 11, or 12 is made of a resin material.

With this structure, the cap member 6 is securely fixed to the container body 5 even upon occurrence of external shock (for example, vibration) during transportation and conveyance. Therefore, dust generation can be prevented.

(5) The mask blank container according to any one of items (1) to (4), wherein the fixing member 9, 11, or 12 fixes at least two opposite sides of the container.

With this structure, the mask blank housed in the container can be fixed under a substantially uniform fixing load. Therefore, even upon occurrence of vibration during transportation and conveyance, it is possible to suppress particle generation due to friction between the mask blank housed in the container and plastic parts of the container supporting the mask blank and to prevent adhesion of particles to the mask blank.

(6) The mask blank container according to any one of items (1) to (5), further comprising an elastic member 7 interposed between the fitting portion 51 of the container body 5 and the fitting portion 61 of the cap member 6.

With this structure, the elastic member is pressed between the container body 5 and the cap member 6. Therefore, the inside of the container is kept in a sealed state.

(7) The mask blank container according to any one of items (1) to (6), further comprising supporting means 8 made of a resin material and formed inside the cap member 6 to support a top of an end face of the mask blank housed in the container.

With this structure, it is possible to securely fix the mask blank even during transportation and conveyance.

(8) A method of housing a mask blank, wherein the mask blank with a resist film is housed in a mask blank container according to any one of items (1) to (7).

According to the method, it is possible to suppress dust generation upon opening or closing the cap member. As a result, it is possible to suppress entry of particles into the container and adhesion of the particles to the mask blank, for example, when the cap member is opened. Furthermore, it is possible to securely fix the mask blank even upon occurrence of vibration during transportation and conveyance so as to prevent dust generation.

(9) A mask blank package in which a mask blank is housed by using a method according to item (8).

With the mask blank package, dust generation upon opening or closing the cap member is suppressed. Therefore, it is possible to suppress entry of particles into the container and adhesion of the particles to the mask blank, for example, when the cap member is opened. Furthermore, it is possible to securely fix the mask blank even upon occurrence of vibration during transportation and conveyance so as to prevent dust generation.

What is claimed is:

1. A mask blank container for housing a mask blank with a resist film, comprising:
    a container body for receiving the mask blank, the container body having an opening;
    a cap member to be put on the container body for closing the opening; and
    a fixing member adapted to fix the container body and the cap member to each other when the cap member is put on the container body;
    wherein the container body and the cap member have fitting portions made of a resin material and fitted to each other, respectively;
    wherein the container body has a side wall portion formed slightly winded outward, the side wall portion of the container body having an engaging portion which is formed at a part of a lower end of the side wall of the container body by one of depressing the part inward and cutting out the part;
    wherein the cap member has a side wall portion formed slightly winded outward, the side wall portion of the cap member having an engaging portion which is formed at a part of an upper end of the side wall portion of the cap member by one of depressing the part inward or cutting out the part;
    when the cap member is put on the container body, the side wall portion of the cap member is flush with the side wall portion of the container body;
    wherein the fixing member comprises:
    a first member having an engaging portion to be engaged with the engaging portion of the cap member; and
    a second member rotatably connected to the first member, the second member having an S-shaped body with a distal engaging portion to be engaged with the engaging portion of the container body;
    wherein a distance between the engaging portions of the first and the second members is variable, and
    wherein the fixing member is removable from the container body and the cap member.

2. The mask blank container according to claim 1, wherein the fixing member further comprises a third member to which each of the first and the second members is rotatably connected.

3. The mask blank container according to claim 1, wherein the fixing member is made of a resin material.

4. The mask blank container according to claim 1, wherein the fixing member fixes the cap member to the container body proximal to at least two opposite sides of the container.

5. The mask blank container according to claim 1, further comprising an elastic member interposed between the fitting portion of the container body and the fitting portion of the cap member.

6. The mask blank container according to claim 1, further comprising a supporting means made of a resin material and formed inside the cap member to support a top of an end face of the mask blank housed in the container.

7. A method of housing a mask blank, wherein the mask blank with a resist film is housed in the mask blank container according to claim 1.

8. A mask blank package in which a mask blank is housed by using the method of housing according to claim 7.

* * * * *